United States Patent
Subramaniam

(10) Patent No.: US 6,991,759 B2
(45) Date of Patent: Jan. 31, 2006

(54) PROCESS FOR PREPARATION OF SEMI-CONDUCTING POLYMER FILM CONTAINING BETA CRYSTALLINE PHASE OF POLYVINYLIDENE FLUORIDE

(76) Inventor: Radhakrishnan Subramaniam, c/o National Chemical Laboratory, Pune, Maharashtra (IN) 411 008

( * ) Notice: Subject to any disclaimer, the term of this patent is extended or adjusted under 35 U.S.C. 154(b) by 0 days.

(21) Appl. No.: 10/731,441

(22) Filed: Dec. 10, 2003

(65) Prior Publication Data

US 2005/0127573 A1 Jun. 16, 2005

(51) Int. Cl.
*B29C 41/00* (2006.01)
(52) U.S. Cl. .......................... 264/435; 524/119
(58) Field of Classification Search .................. 524/1, 524/492–493, 495, 119; 264/435
See application file for complete search history.

(56) References Cited

U.S. PATENT DOCUMENTS

| | | | | |
|---|---|---|---|---|
| 4,808,352 A | * | 2/1989 | Bhateja | 264/435 |
| 4,820,585 A | * | 4/1989 | Tedesco et al. | 428/360 |
| 5,254,296 A | * | 10/1993 | Perlman | 264/435 |
| 6,331,330 B1 | * | 12/2001 | Choy et al. | 427/475 |
| 6,746,627 B2 | * | 6/2004 | Niu et al. | 252/511 |
| 2005/0065280 A1 | * | 3/2005 | Subramaniam et al. | 524/800 |

* cited by examiner

Primary Examiner—Evan Pert
(74) Attorney, Agent, or Firm—Nixon & Vanderhye P.C.

(57) ABSTRACT

The present invention provides a process for preparation of semi-conducting polymer film containing beta crystalline phase of polyvinylidene fluoride which have a large number of application in piezoelectric devices viz. electromechanical sensors, tactile sensors for robotics, touch sensitive switches etc, which can be made at low temperatures and at low electric fields and having low resistivity/semi-conducting range.

14 Claims, No Drawings

PROCESS FOR PREPARATION OF SEMI-CONDUCTING POLYMER FILM CONTAINING BETA CRYSTALLINE PHASE OF POLYVINYLIDENE FLUORIDE

FIELD OF THE INVENTION

The present invention relates to a process for the preparation of semi-conducting polymer film containing beta crystalline phase of polyvinylidene fluoride. More particularly, the present invention provides a process for preparation of polymeric films with high beta crystalline phase of polyvinylidene fluoride at low electric field poling.

BACKGROUND OF THE INVENTION

Polymers having piezoelectric effect such as polyvinylidene fluoride (PVDF) are important for many areas in industry such as electret microphones, hydrophones, vibration sensing and damping, tactile sensors for robotics, etc. However, PVDF has to be specially treated so as to form the beta crystalline phase which exhibits the piezoelectric effect. Hence, there have been some efforts made in the past to synthesize polyvinylidene fluoride in beta crystalline phase. Some reports are available in literature (H. S. Nalwa, Ferroelectric Polymers, Marcel Dekker, N.Y, 1995, ch. 3) which indicate that under certain conditions of high orientation/stretching and high voltage electric field treatment at elevated temperatures (>80° C.) the polyvinylidene fluoride based polymers have predominantly beta phase. These cause many difficulties in processing techniques: the requirements of very high electric fields (>$10^6$ V/m) which can cause hazards of electric shocks, the films should have very little defects and high dielectric breakdown strength so that these do not puncture during electric poling and also mechanically the films should withstand stretching operation. Further, such films cannot be easily integrated with electronic devices or circuits. In order to overcome these drawbacks, an alternative process for preparation of beta crystalline polyvinylidene fluoride is necessary. However, there is no prior art for the preparation of beta crystalline phase of polyvinylidene fluoride at low electric field or without mechanical stretching or semi-conducting film containing the same.

OBJECTS OF THE INVENTION

The main object of the present invention is to provide a process for preparation of beta crystalline phase of polyvinylidene fluoride at low temperature, low electric field, without stretching or mechanical deformation and in semi-conducting state.

SUMMARY OF THE INVENTION

Accordingly, the present invention provides a process for the preparation of semi-conducting polymer film containing beta crystalline phase of polyvinylidene fluoride, the process comprising forming a solution by dissolving polyvinylidene fluoride in a solvent, dispersing conducting particles therein, casting the dispersed solution on a substrate, evaporating the solvent, drying the film, holding the film between two metal plates and applying an electric potential thereto, removing the film to obtain a polymer film containing high beta crystalline phase of polyvinylidene fluoride.

In one embodiment of the invention, the polyvinylidene fluoride used has an ethylene content of less than 2%.

In another embodiment of the invention, the solvent used for dissolving and casting the film has an amide substituted group and has dielectric constant between 20 to 45.

In another embodiment of the invention, the conducting particles added to the solution have a particle size in the range of 0.1 to 20 micrometers and concentration in the range of 2 to 50% by weight of the polymer, preferably 3 to 305 and more preferably 20%.

In yet another embodiment of the invention the conducting particles have a conductivity in the range of $10^{-3}$ to $10^4$ S/cm.

In another embodiment of the invention the polymer film is cast in stainless steel dish at a temperature in the range of 45° to 90° C.

In another embodiment of the invention, the electric potential used for treatment is in the range of 10 V to 100 V.

In another embodiment of the invention, the electric potential is applied by holding the film between two metal plates and applying the electric potential for a duration of 10 to 300 min, more preferably for 60 minutes.

In still another embodiment of the invention the temperature used for conditioning is in the range of 40° C. to 100° C. preferably 80° C.

In another embodiment of the invention, the film is cast by spin coating on smooth substrates and metal electrodes are deposited on both sides of the film to form a device directly containing the beta crystalline phase of polyvinylidene fluoride.

DETAILED DESCRIPTION OF THE INVENTION

The present invention provides a process for the preparation of semi-conducting polymer film containing beta crystalline phase of polyvinylidene fluoride, the process comprising forming a solution by dissolving polyvinylidene fluoride in a solvent, dispersing conducting particles therein, casting the dispersed solution on a substrate, evaporating the solvent, drying the film, holding the film between two metal plates and applying an electric potential thereto, removing the film to obtain a polymer film containing high beta crystalline phase of polyvinylidene fluoride. The polyvinylidene fluoride used has an ethylene content of less than 2%.

The solvent used for dissolving and casting the film preferably has an amide substituted group and has dielectric constant between 20 to 45. The conducting particles added to the solution have a particle size in the range of 0.1 to 20 micrometers, concentration in the range of 2 to 30% and a conductivity in the range of $10^{-3}$ to $10^4$ S/cm. The polymer film is cast in stainless steel dish at a temperature in the range of 45° to 90° C. The electric potential used for treatment is in the range of 10 V to 100 V and is preferably applied by holding the film between two metal plates and applying the electric potential for a duration of 60 to 300 min. The temperature used for conditioning is in the range of 40° C. to 100° C. preferably 80° C. The film can also be cast by spin coating on smooth substrates and metal electrodes are deposited on both sides of the film to form a device directly containing the beta crystalline phase of polyvinylidene fluoride.

The process of the present invention is described hereinbelow with examples, which are illustrative and should not be construed to limit the scope of the invention in any manner.

EXAMPLE-1

Polyvinylidene fluoride (0.2 gm.) was dissolved in 30 ml. dimethyl acetamide at 50° C. to which were then added 0.02 gm of polyaniline powder having conductivity in the range of 1 S/cm and particle size in the rage of 2 to 3 micro meters. The whole mixture was stirred for 24 hrs at R.T to form a uniform conducting polymer blend. This was cast in clean glass petri-dish by complete solvent evaporation in the 50° C. and then dried under vacuum to give polymer films (30 $\mu$m thick). This film was placed between two metal plates, the whole assembly was conditioned at 30° C. and a voltage of 25 V was applied to same for 60 min. The films were cooled and removed from the electrodes and examined for beta crystalline content by x-ray diffraction analysis. The results are indicated in Table-1.

EXAMPLE-2

0.2 gm. of polyvinylidene fluoride polymer (Aldrich grade) was first dissolved in 30 ml. of dimethyl acetamide at 50° C. and then 0.03 gm of graphite powder (particle size 5 to 7 $\mu$m) with conductivity of 100 S/cm was added to same to get semi-conducting composition. The solution was stirred for 24 hrs at 30° C. to form a uniform polyvinylidene fluoride-graphite dispersion. This was cast in clean glass petridish followed by complete solvent evaporation in the 50° C. and then dried under vacuum to give polymer films (30 $\mu$m). This film was subjected to electrical poling treatment as follows. The film was placed between two aluminum foil electrodes (1 cm×1 cm.) to which electrical wires were attached for application of voltage. The temperature was raised to 80° C. and a voltage of 100 V was applied for 3 hr. The films were cooled and removed from the electrodes and examined for beta crystalline content by x-ray diffraction analysis. The results are indicated in Table-1.

EXAMPLE-3

0.2 gm. of PVDF polymer was first dissolved in 30 ml. of dimethyl acetamide at 50° C. and then 0.06 gm of colloidal silver dispersion in amyl acetate (particle size 2–3 $\mu$m) was added to get 30% blend composition. The solution was stirred for 24 hrs at 25° C. to form an uniform slurry. This was cast in clean glass petri-dish followed by complete solvent evaporation in the 50° C. and then dried under vacuum for 24 hrs to give a polymer film (30 $\mu$m). This film was subjected to electrical poling treatment as follows. The film was placed between two aluminum foil electrodes (1 cm×1 cm.) to which electrical wires were attached for application of voltage. The temperature was raised to 80 C and a voltage of 100 V was applied for 3 hr. The films were cooled and removed from the electrodes and examined for beta crystalline content by x-ray diffraction analysis. The results are indicated in Table-1.

TABLE 1

The Beta Crystalline Phase Content in the Polymer Films

| Polymer film | Electric Poling Conditions | Beta Crystalline phase content (%) | Electrical conductivity (ohm-cm)$^{-1}$ |
|---|---|---|---|
| Example - 1 | Room Temperature, 25 V | 43 | 2.7 × 10$^{-4}$ |
| Example - 2 | 80° C., 100 V | 47 | 1.1 × 10$^{-3}$ |
| Example - 3 | 80° C., 100 V | 49 | 1.0 × 10$^{-3}$ |
| Polyvinylidene fluoride film cast from dimethyl acetamide without additive and as such | 80° C., 100 V | 0 | 1.3 × 10$^{-13}$ |

* Beta crystalline content determined from the intensity of X-ray diffraction peak at 2 θ of 20.4 (±0.1) degrees.

It can be seen by comparing the results given in the above Table-1 that the polymer film prepared by the process described in the present invention has high beta crystalline phase content than otherwise. It can also be observed that these films are semi-conducting as compared to the normal insulating polyvinylidene fluoride.

The main advantage of the present invention is that it provides a simple and safe method of preparation of polymer film having beta crystalline phase of polyvinylidene fluoride using low voltages and which can be directly applied on different substrates by solution coating. Further, the polymer film can be easily made into device or integrated with other devices without the need for mechanical deformation or bonding with adhesives.

I claim:

1. A process for the preparation of semi-conducting polymer film containing a beta crystalline phase of polyvinylidene fluoride, the process comprising:
    forming a solution by dissolving polyvinylidene fluoride in a solvent,
    dispersing conducting particles therein,
    casting the dispersed solution on a substrate,
    evaporating the solvent,
    drying the film,
    holding the film between two metal plates and applying an electric potential thereto, and removing the film to obtain a polymer film containing high beta crystalline phase of polyvinylidene fluoride.

2. A process as in claim 1 wherein the polyvinylidene fluoride used has an ethylene content of less than 2%.

3. A process as in claim 1 wherein the solvent used for dissolving and casting the film has an amide substituted group and has a dielectric constant between 20 to 45.

4. A process as in claim 1 wherein the conducting particles added to the solution have a particle size in the range of 0.1 to 20 micrometers and concentration in the range of 2 to 50% by weight of the polymer.

5. A process as in claim 4, wherein the concentration of the conducting particles ranges from 3% to 30%.

6. A process as in claim 4, wherein the concentration of the conducting particles is 20% by weight of the polymer.

7. A process as in claim 1 wherein the conducting particles have a conductivity in the range of 10$^{-3}$ to 10$^4$ S/cm.

8. A process as in claim 1 wherein the polymer film is cast in stainless steel dish at a temperature in the range of 45° to 90° C.

9. A process as in claim 1 wherein said electric potential is in the range of 10 V to 100 V.

10. A process as in claim 1 wherein the electric potential is applied by holding the film between two metal plates for a duration of 10 to 300 min.

11. A process as in claim 1 wherein said electric potential is applied for a duration of at least about 60 minutes.

12. A process as in claim 1 wherein the polymer film is conditioned at a temperature in the range of 40° C. to 100° C.

13. A process as in claim 1 wherein the polymer film is conditioned at a temperature of about 80° C.

14. A process as in claim 1 wherein the film is cast by spin coating on smooth substrates and metal electrodes are deposited on both sides of the film to form a device directly containing the beta crystalline phase of polyvinylidene fluoride.

* * * * *